(12) United States Patent
Lai

(10) Patent No.: US 7,359,690 B2
(45) Date of Patent: Apr. 15, 2008

(54) SINGLE PATH FRONT END WITH DIGITAL AGC IN SDARS SYSTEM

(75) Inventor: Yhean-Sen Lai, Warren, NJ (US)

(73) Assignee: Agere Systems Inc., Allentown, PA (US)

( * ) Notice: Subject to any disclaimer, the term of this patent is extended or adjusted under 35 U.S.C. 154(b) by 488 days.

(21) Appl. No.: 11/133,538

(22) Filed: May 20, 2005

(65) Prior Publication Data

US 2006/0264191 A1 Nov. 23, 2006

(51) Int. Cl.
*H04B 1/06* (2006.01)
(52) U.S. Cl. .............. 455/240.1; 455/3.02; 455/168.1; 455/250.1; 375/345
(58) Field of Classification Search .............. 455/3.02, 455/150.1, 168.1, 180.1, 234.1, 240.1, 250.1, 455/339, 341; 375/345
See application file for complete search history.

(56) References Cited

U.S. PATENT DOCUMENTS

| | | | |
|---|---|---|---|
| 6,542,203 B1 * | 4/2003 | Shadwell et al. ........... 348/726 |
| 6,766,148 B1 * | 7/2004 | Mohindra .................... 455/73 |
| 2003/0064696 A1 * | 4/2003 | Akamine et al. ........... 455/311 |
| 2004/0161026 A1 * | 8/2004 | Jensen et al. ................ 375/224 |
| 2004/0214529 A1 * | 10/2004 | Terao ........................... 455/78 |
| 2005/0096004 A1 * | 5/2005 | Tso et al. .................... 455/334 |

* cited by examiner

*Primary Examiner*—Edward F. Urban
*Assistant Examiner*—Nhan T. Le
(74) *Attorney, Agent, or Firm*—Synnestvedt & Lechner LLP

(57) ABSTRACT

A method and apparatus for automatically controlling the gain of a digital radio receiving circuit in which a single set of analogue amplifiers is used as the front end to feed two separate digital back-end, demodulating circuits, and in which, for optimal performance, each of the two digital demodulating circuits require the front end analogue amplifiers to operate over a significantly different dynamic range. An automatic-gain-control selector selects one of two automatic-gain control signals to set the gain of the analogue amplifier. In addition, the automatic-gain-control selector sets a compensatory gain of a digital automatic gain control in the back-end circuit not selected, so that the unselected demodulating circuit has substantially the same input signal as if it had been selected. In this way, both demodulating circuits can process the input signal as if they were in control of the analogue amplifier.

23 Claims, 5 Drawing Sheets

SINGLE PATH FRONT END WITH DIGITAL AGC IN SDARS SYSTEM

FIELD OF THE INVENTION

The present invention relates to automatic gain control in radio receivers, and particularly to automatic gain control in digital radio receivers adapted to receive multiple types of signals using a single path front end.

BACKGROUND OF THE INVENTION

Satellite digital audio radio services (SDARS) broadcast audio programming directly from a satellite to an end user's radio receiver so that a typical SDAR broadcast reaches an extensive, diverse, geographical region. In order to ensure high quality, uninterrupted transmission in all the reception regions reached by the broadcast, SDAR providers typically complement their satellite broadcast with gap-filling rebroadcasts using terrestrial stations located in regions having poor or no satellite reception, such as cities with tall buildings. The signals broadcast from the satellite and by the terrestrial stations contain the same audio data, and are typically on adjacent frequencies but use different coding techniques. The terrestrial signals are also typically broadcast at significantly higher signal strength, primarily because terrestrial stations have easy access to electrical power while satellites are limited to the electrical power available from their solar panels.

FIG. 1 is a schematic drawing showing an exemplary SDAR system 10 provided by Sirius Radio Systems of New York, N.Y., which broadcasts over one-hundred channels of audio programming directly from satellites to users equipped with appropriate receivers. Two geo-synchronous satellites 12 and 14 transmit time division multiplexed (TDM) signals 16 and 18 directly to the end user's receiver 20 using two S band (2.3 GHz) frequencies. The end user's receiver 20 is typically a mobile receiver in an automobile or a truck. In regions with poor satellite reception, terrestrial repeater stations 22 broadcast a coded orthogonal frequency division multiplexed (COFDM) signal 24 containing the same audio data as that broadcast in the satellite signals. The terrestrial COFDM signals 24 are broadcast at an S band frequency, lying between the frequencies of the two, satellite TDM signals 16 and 18, and at a significantly higher power level.

FIG. 2 shows a schematic diagram of a prior art, digital radio receiver designed to receive and decode the audio channels contained in the Sirius system signals. The receiver 26 has two decoding circuits 28 and 30, one for receiving TDM signals directly from the satellites and one for receiving COFDM signals. The TDM decoding circuit 28 has a TDM antenna 32 for receiving the signal, which is then amplified by TDM RF amplifier 34 and the TDM IF amplifier 36. The amplified signal is digitized by a TDM analogue-to-digital converter (ADC) 38. The digitized TDM signals are down-converted by TDM digital-down-converter (DDC) 40, before being demodulated. In the Sirius system, one geo-synchronous satellite has a version of the signal that is delayed by four seconds, so there are two TDM demodulators 42 and 44, one for handling the un-delayed signal and one for handling the delayed signal.

The ADC 38, which is typically a 10 bit device with a usable dynamic range of about 60 dB, plays an important role in digital radio reception. As long as the digitized signal is an accurate representation of the incoming analogue signal, digital filtering techniques make it possible to extract very weak signals, such as those received from a satellite, even in the presence of a significant amount of noise. Accurate digitization requires that the incoming signal is amplified sufficiently to fill as much of the ADC's dynamic range as possible. It is, however, also very important not to over amplify the incoming signal since, when the ADC is overdriven and overflows, a small signal in a noisy background can be completely lost. This happens because the ADC simply truncates any excess signal.

The appropriate gain setting of amplifiers 34 and 36 that amplifies the incoming signal to the optimal level for the ADC is controlled by the TDM automatic gain control (TDM AGC) 48. The TDM AGC monitors the demodulated TDM signals TDM1 and TDM2, and uses the stronger of the two demodulated TDM signals, selected by the Max selector 46, to set the gain of amplifiers 34 and 36 so that the portion of the received signal containing the best TDM signal is amplified appropriately, and a constant volume output is obtained.

Any available COFDM signal is demodulated using a parallel COFDM decoding circuit 30, having COFDM antenna 50, COFMD RF amplifier 52, COFMD IF amplifier 54, COFDM ADC 56, COFDM digital down converter 58, COFDM demodulator 60, and COFDM AGC 60.

In prior art receivers designed for the Sirius system, the front end of both the TDM and the COFDM decoding circuits 28 and 30 contain substantially identical components, i.e., the TDM and COFMD antennas 32 and 50, the TDM and COFDM RF amplifiers 34 and 52, the TDM and COFMD IF amplifiers 36 and 54 and TDM and COFMD ADCs 38 and 56 are the same as each other. In order to reduce the power requirements and the cost of receivers, it is highly desirable to have a receiver with only one front-end, i.e., only one antenna, one RF amplifier, one IF amplifier and one analogue-to-digital converter (ADC).

Practical implementation of a single front-end circuit is not, however, simple. A major problem in such a circuit is that the amplifier gain settings for the two types of signal may be incompatible with each other. This causes difficulties if the amplifier gains are controlled using a simple, two-state AGC, with one state to optimize the gain for a COFDM signal and one state to optimize the amplifier gain for a TDM signal. In such a system, the overall gain of the front-end amplifiers that is optimal for the weak TDM signals from the satellites typically will over-amplify the incoming COFDM signal from the terrestrial stations, resulting in the COFDM signal over-flowing the ADC's dynamic range. This overflow of the ADC's dynamic range means that the demodulated COFDM audio data is of very poor quality, and may even be non-existent. The receiver may be "blinded" to the presence of a good COFDM signal and simply stick with a poor quality TDM signal until the TDM signal is completely lost.

Similarly, if the amplifiers gain settings are optimal for the ADC to digitize the portion of the signal containing the stronger, COFDM signal, the portion of the signal containing the TDM signal will be under-amplified, and poorly digitized by the ADC. The result is that if the receiver does lock on to a terrestrial COFDM signal, it may stay locked onto the terrestrial signal, even if there is a better satellite signal available.

In order to achieve the highly desirable power and cost savings that a single power amplifier and ADC would provide, it is necessary to have an automatic gain control that can adjust the amplifiers gains in a way that makes it possible to use the best available signal, and not to be blinded to the availability of a better signal by either under or over amplifying any portion of the signal with respect to the ADC dynamic range.

SUMMARY OF THE INVENTION

Briefly described, the invention provides a method and apparatus for automatically controlling the gain of a digital radio receiving circuit in which a single set of analogue amplifiers is used as the front-end to feed two separate digital demodulating, back-end circuits, and in which, for optimal performance, each of the two digital demodulating circuits requires the front-end analogue amplifier to operate over a significantly different dynamic range.

In a preferred embodiment, the first digital back-end circuit determines a first automatic-gain-control signal that would be the preferred gain setting of the analogue amplifier, if the analogue amplifier were operating within the dynamic range that provides optimal performance for the demodulation portion of that first digital back-end.

At the same time, the second digital back-end determines a second automatic-gain-control signal that would be the preferred gain setting of the analogue amplifier if the analogue amplifier were operating within the dynamic range that provides optimal performance for the demodulation portion of the second digital back-end circuit.

An automatic-gain-control selector then compares the automatic-gain control signals, and selects one of them to set the gain of the analogue amplifier. The choice of which signal to use is based on the current setting of the analogue amplifier and the values of the signals. In addition, the automatic-gain-control selector also sets a compensatory gain of a digital automatic gain control in the back-end circuit that was not selected to control the analogue amplifier. In this way, the demodulating portion of the unselected back-end sees an input that is substantially what it would have seen, were that back-end in control of the analogue amplifier. In this way, both back-end circuits process the input signal as if they are in control of the analogue amplifier, and may, therefore, make use of control algorithms developed for dual front-end, prior art systems.

These and other features of the invention will be more fully understood by reference to the following drawings.

DETAILED DESCRIPTION

The present invention is a method and apparatus for automatically controlling the gain of a single set of analogue front-end amplifiers having an output that is connected to two separate, digital back-ends via a single analogue-to-digital converter.

A preferred embodiment of the invention is particularly applicable when each of the two back-end circuits requires the front-end analogue amplifiers to operate over a significantly different dynamic range for optimal demodulation of the received signals.

In a preferred embodiment of the present invention, both back-end circuits essentially process the input signal as if that back-end were in control of the analogue amplifier. This allows automatic gain control algorithms developed for dual front-end, prior art systems to be used with only minor modification.

In particular, the two prior art, automatic gain controls are modified so that they both provide output signals covering the largest dynamic range required, i.e., they can both boost the analogue gain to the level required by the larger dynamic range signal. At the same time, an analogue automatic gain control selector (AGC selector) circuit is added to select which of the two gain control signals to use, and two digital automatic gain control (DAGC) circuits are inserted into the system at the front of the back-end path. The function of these additional DAGC circuits is to correct the gain of the incoming signal back to what it would have been if the AGC of that circuit were in control of the front end.

For instance, in an exemplary embodiment of the invention, if the AGC selector circuit selects the first AGC signal to control the front-end amplification, the signal going to the first back-end may be unaffected, but the signal going to the second back-end may be digitally boosted after the ADC so that the second back-end can more effectively extract any signal.

Similarly, if the ACC selector circuit selects the second AGC to control the front-end amplification, the signal going to the second back-end may be unaffected but the signal going to the first-back end may be digitally reduced after the ADC so that the first back-end can more effectively extract any signal.

In this way, both demodulating circuits may essentially process the input signal as if they are in control of the analogue amplifier, and therefore, make use of control algorithms developed for dual front-end, prior art systems.

These and other features of the invention will now be described in greater detail by reference to the accompanying drawings in which, as far as possible, like numbers represent like elements.

Figure 3:
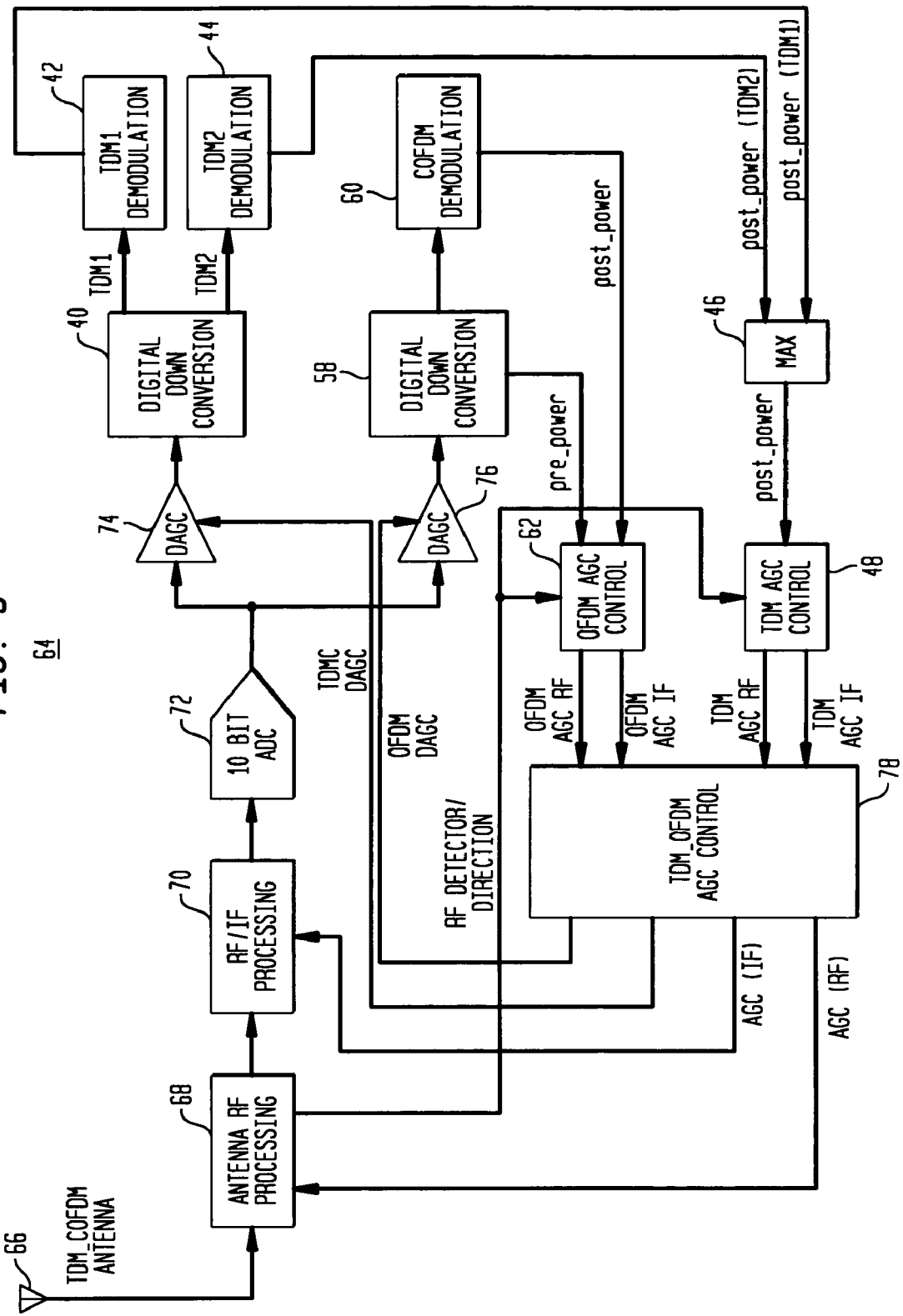
FIG. 3 is a schematic diagram showing a single path front end digital radio receiver for SDAR using Digital Automatic Gain Control (DAGCs).

FIG. 3 is a schematic diagram showing a single path front end digital radio receiver for SDAR using digital ACGs.

The digital radio receiver 64 comprises a single receiving antenna 66, a single RF amplifier 68, a single IF amplifier 70 and a single ADC 72. The receiver then has a TDM back-end and an OFDM back-end, and a TDM_OFDM AGC 78.

The TDM back-end is comprised of a TDM Digital Automatic Gain Control (DAGC) 74 followed by the same elements as the prior art TDM back-end, namely, a TDM digital-down-converter (DDC) 40, two TDM demodulators 42 and 44, one for handling the un-delayed signal and one for handling the delayed signal, and a max selector 46 for selecting which demodulated single, TDM1 or TDM2, the TDM AGC 48 should make use of in providing the TDM AGC RF and TDM AGC IF signals to set the gains of the RF amplifier 68 and the IF amplifier 70.

The OFDM back-end is comprised of an OFDM Digital Automatic Gain Control (DAGC) 76 followed by the same elements as the prior art OFDM back-end, namely, an OFDM digital-down-converter (DDC) 58, a OFDM demodulator 60 and an OFDM AGC 62 for providing the OFDM AGC RF and OFDM AGC IF signals to set the gains of the RF amplifier 68 and the IF amplifier 70.

The TDM_OFDM AGC 78 acts as an automatic gain control selector, and selects whether to use the TDM AGC RF and TDM AGC IF or the OFDM AGC RF and OFDM AGC IF signals to set the gains of the RF amplifier 68 and the IF amplifier 70. This selection is made using an algorithm that is described in more detail below.

Based on which AGC is selected, the TDM_OFDM AGC 78 also sends signals TDM DAGC and OFDM DAGC to the TDM DAGC 74 and OFDM DAGC 76, respectively. These signals instruct the DAGC's to adjust the signals being fed to the TDM and OFDM backends appropriately.

In particular, if the OFDM AGC settings are being used to control the analogue amplifiers 68 and 70, then the OFDM DAGC may make no adjustment to the signal, while the TDM DAGC may adjust the signal to a level that corresponds to an amplification that the signal would have had, had the TDM AGC settings been selected. In this way, the prior art control algorithms can be used by TDM AGC.

Similarly, when the TDM AGC settings are being used to control the analogue amplifiers 68 and 70, then the TDM DAGC may make no adjustment to the signal, while the OFDM DAGC may adjust the signal to a level that corresponds to an amplification that the signal would have had, had the OFDM AGC settings been selected. In this way, the prior art control algorithms can be used by OFDM AGC.

Figure 1:
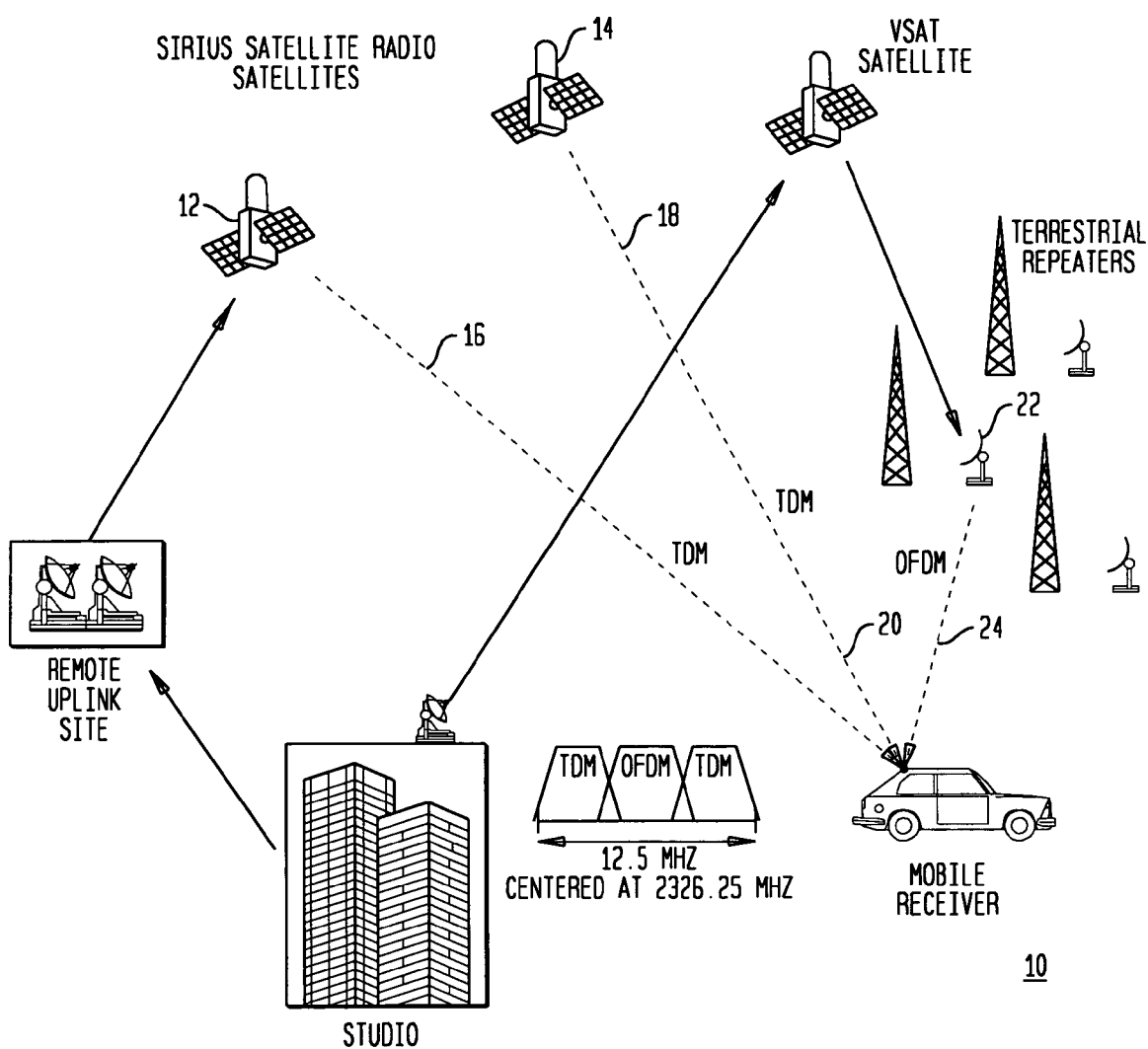
FIG. 1 is a schematic drawing showing an exemplary Satellite Digital Audio Radio (SDAR) system.
Figure 2:
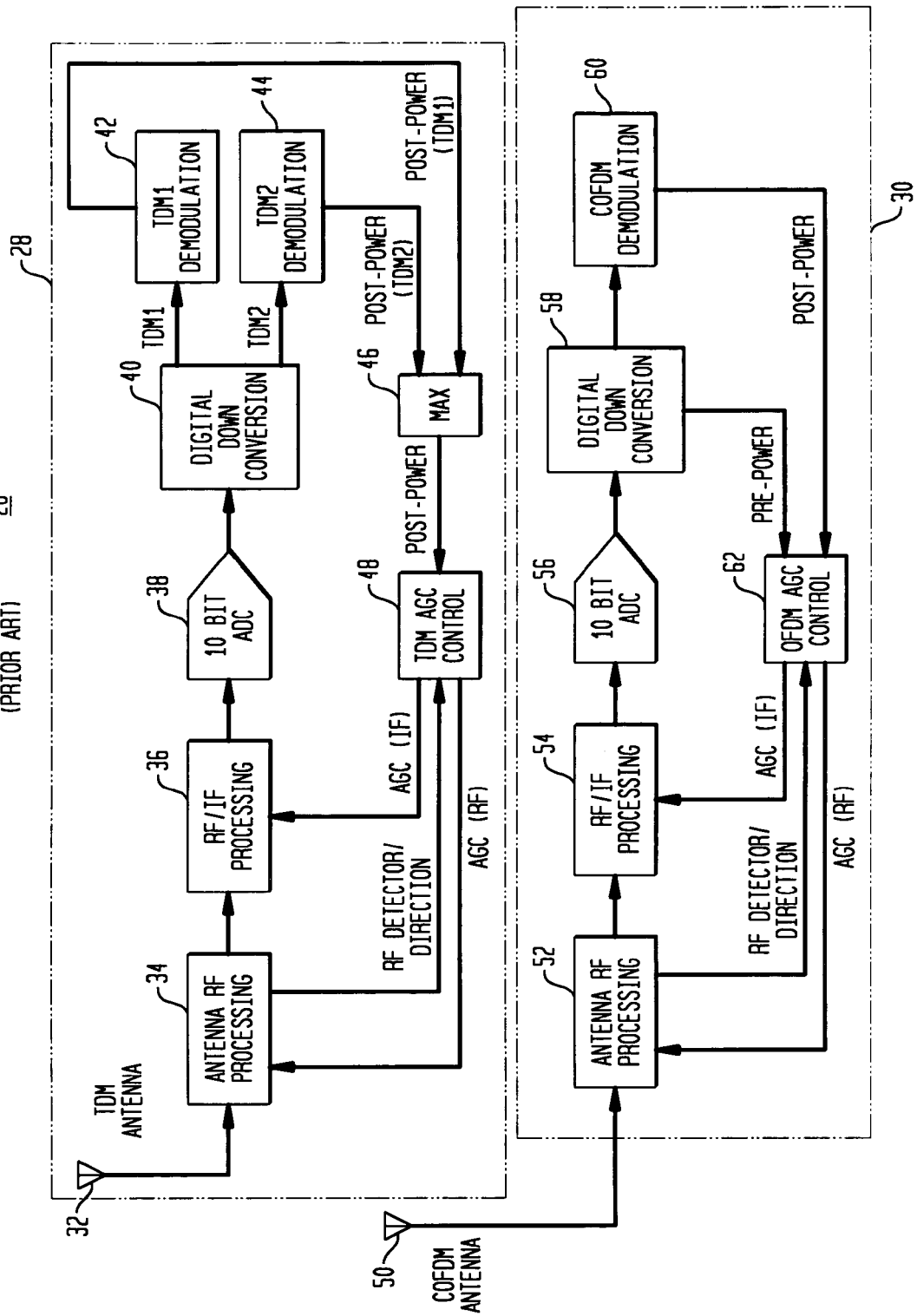
FIG. 2 is a schematic diagram showing a prior art, digital radio receiver designed to receive and decode the audio channels contained in the Sirius system signals.

In an exemplary embodiment of the prior art receiving system shown in FIG. 2, the TDM signal path has a post power setpoint of 10.4 dB. As the TDM AGC covers a dynamic range of −37 to +37 dB, this value of the setpoint allows sufficient headroom to avoid saturation in the ADC even in the event that the TDM signal is blocked, and the TDM AGC boosts the analogue front end by the maximum amount (+37 dB). In the exemplary prior art receiver, the TDM covers the 74 dB dynamic range using three rf states (1, 0, −1) that select an RF gain of 10 dB, 0 dB and −10 dB respectively. The IF gain is then selected to be from −27 dB to +27 dB in 1 dB increments. The combination of these settings allows a front-end gain that ranges from −37 dB to +37 dB, providing 74 dB dynamic range.

In the prior art, the OFDM signal path uses both pre-power and post-power set points. The pre-power set point is the signal value after the digital down-conversion and is typically 45.2 dB. The post-power set point is the signal value after demodulation and is typically 35.2 dB. The pre-power signal includes unused frequencies and noise which is why it is set 10 dB higher.

The OFDM AGC provides a dynamic range of 130 dB using five RF states providing RF gains from −30 dB to +30 dB in 15 db increments. The IF gain is selected to be from −35 dB to +35 dB in 1 dB increments. The total analogue gain is therefore from −65 dB to +65 dB for a total of 130 dB.

In the single front-end receiver of this invention, the TDM AGC 48 is modified from the prior art so as to provide a smooth handoff between TDM and OFDM signal reception. In particular, in a preferred embodiment, the TDM AGC 48 provides a dynamic range of 126 dB. This may be implemented by, for instance, five RF states that select an RF amplification from −28 dB to +28 dB in 14 dB increments, and allowing the IF gain to be selected to be from −35 dB to +35 dB in 1 dB increments. In this way the total gain can be set from −63 dB to +63 dB. The initial setting of the receiver selects the RF state providing 0 dB amplification. The RF gain states may then be changed using the RF detection/direction information. The IF gain may be changed based on a Least Mean Square (LMS) average of the maximum post power signal extracted from the TDM path. The IF gain is typically updated at 100 Hz and the RF gain is typically updated at 50 Hz.

In the single front-end receiver of this invention, the OFDM AGC 62 covers the same dynamic range, i.e., 126 dB. This may be implemented in the same steps as for the TDM AGC 48, i.e., five RF state that select an RF amplification from −28 dB to +28 dB in 14 dB increments, and allowing the IF gain to be selected to be from −35 dB to +35 dB in 1 dB increments. The RF gain may then be changed using the RF detection/direction information. The IF gain may be changed based on a Least Mean Square (LMS) average of the pre-power and the post power signals extracted from the OFDM path. The IF gain is typically updated at 100 Hz and the RF gain is typically updated at 50 Hz.

The TDM_OFDM AGC 78 selects which of the AGC signals to use to actually control the RF amplifier 68 and the IF amplifier 70. In addition, the TDM_OFDM AGC 78 provides a signal to both the TDM DAGC 74 and the OFDM DAGC 76 that adjusts each of the signal paths to their own independent setpoints.

Figure 4:
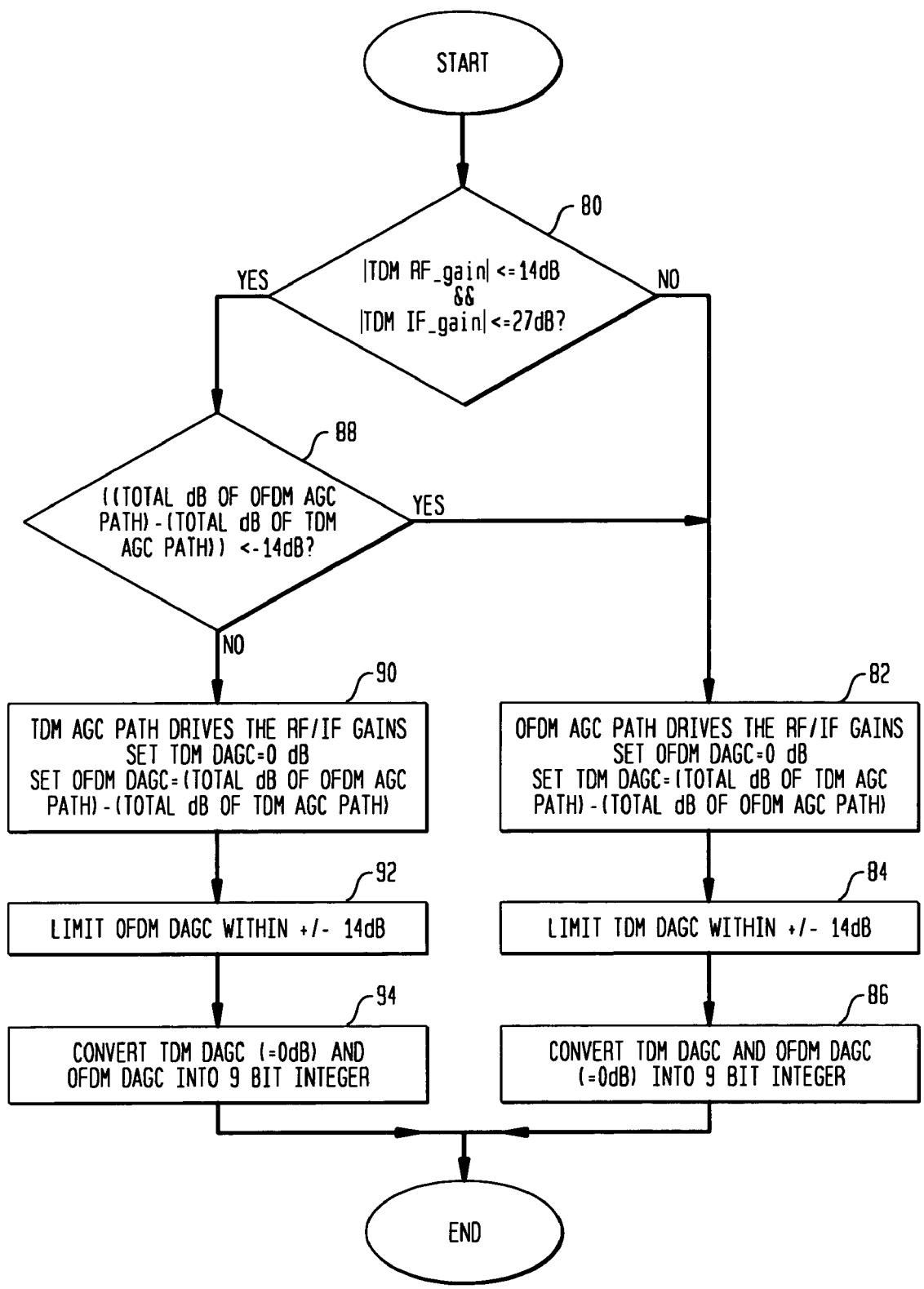
FIG. 4 is a flow chart showing the steps in selecting the AGC signal and controlling the DAGCs.

FIG. 4 is a flow chart showing the steps taken by the TDM_OFDM AGC controller 78 in selecting the AGC signal and controlling the DAGCs in a preferred embodiment of the invention.

In step 80, the TDM_OFDM AGC controller 78 examines signals from the TDM AGC 48. If the TDM ADC 48 is attempting to set either the absolute RF gain to be greater than 14 dB or the absolute IF gain to be greater than 27 dB, then the algorithm goes to step 82, and selects the gains being supplied by the OFDM AGC 62 as these settings indicate that TDM demodulators are detecting no usable demodulated signal and are now attempting to boost the incoming signal beyond the usable range of the TDM backend. In step 82, an initial attempt is made to set the gains of the DAGCs. The algorithm initially selects to set the OFDM DAGC to zero dB, as the OFDM AGC signal is controlling the front-end amplifiers and no compensation is required in the OFDM back-end. The algorithm then attempts to select a TDM DAGC setting that will allow the TDM back-end to reach its pre-selected setpoint. The initial setting of the TDM DAGC is, therefore, the difference between the total gain in the TDM AGC path and the total gain in the OFDM AGC path, as this effectively reduces the gain in the TDM back-end to the gain that would have been seen had the TDM DAGC been in control of the front-end.

In step 84, the algorithm checks the value of the TDM DAGC setting. In order to keep component costs down, the DAGC circuits 74 and 76 are only designed to adjust the signal passing through them by ±14 dB. If the TDM DAGC setting being called for exceeds the capability of the DAGC, i.e. ±14 dB, the TDM DAGC is limited to ±14 dB. At the same time, the gain values to the IF and RF amplifiers are equal to those required by the OFDM AGC 62. In other words the OFDM path amplification is now supplied by the front-end amplification while the TDM path amplification is supplied by a combination of front-end amplification and DAGC attenuation. In this way, the OFDM backend can operate with a signal over the 126 dB dynamic range of AGC necessary to maintain a post-power set point of 35.2 dB, while the TDM backend can be limited to operate over a dynamic range of 74 dB of AGC and maintain a post-power set point of 10.2 dB.

For instance, if both TDM and OFDM signals are blocked and both AGC's start increasing their requirements on the gain of the IF and RF amplifiers, as soon as the absolute value of the TDM RF gain is greater than 14 dB or the absolute value of the TDM IF gain is greater than 27 dB, the OFDM AGC 62 will take control. If the OFDM signal is also blocked, the OFDM AGC 62 will eventually be calling for a maximum front-end gain. The system will then adjust the IF and RF gain to be 45.2 dB, which includes 2 TDM signals and one OFDM signal, and set the TDM DAGC to be the minimal value at −14 dB, and the OFDM DAGC gain to be 0 dB. The net result will be that the signal going into the TDM down converter 40 is boosted by 31.2 dB, while the signal going into the OFDM down converter 58 is boosted by 45.2 dB.

In step 86, the required TDM and OFDM DAGC settings are converted into 9 bit integers and sent to the DAGC's 74 and 76.

If, however, in step 80, the TDM RF and IF gains are within ±14 dB and ±27 dB respectively, then the algorithm goes to step 88 and examines the total gain in the OFDM AGC path and the TDM AGC path. If the value obtained by subtracting the total gain in the OFDM AGC path from the total gain in the TDM AGC path is less than −14 dB, then the system proceeds to step 82, and uses, the OFDM AGC signals as the control settings for the analogue RF and IF amplifiers 68 and 70.

If, however, the value obtained by subtracting the total gain in the OFDM AGC path from the total gain in the TDM AGC path is greater than or equal to 14 dB, then the system proceeds to step 90 and uses the TDM AGC 48 settings for the gain of the analogue RF and IF amplifiers 68 and 70, as this is an indication that there is a good TDM signal being received from one of the satellites. In step 90, an initial attempt is made to set the gains of the DAGC's. The algorithm initially selects to set the TDM DAGC to zero dB as all the gain required for the TDM backend is being supplied by the TDM_AGC 48 controlled front-end amplifiers. The algorithm then attempts to select a OFDM DAGC setting that will allow the OFDM back-end to reach its pre-selected setpoint, so that the OFDM_AGC can operate as if it were in control of the front-end amplifiers. The initial setting of the OFDM DAGC is, therefore, the difference between the total gain in the OFDM AGC path and the total gain in the TDM AGC path.

In step 92, the OFDM DAGC signal is examined. In order to keep component costs down, the DAGC circuits 74 and 76 are only designed to adjust the signal passing through them by ±14 dB. If the OFDM_DAGC signal being called for is outside the range ±14 dB, it is limited to ±14 dB. The gain values of the IF and RF amplifiers remain those required by the TDM AGC 48.

Figure 5:
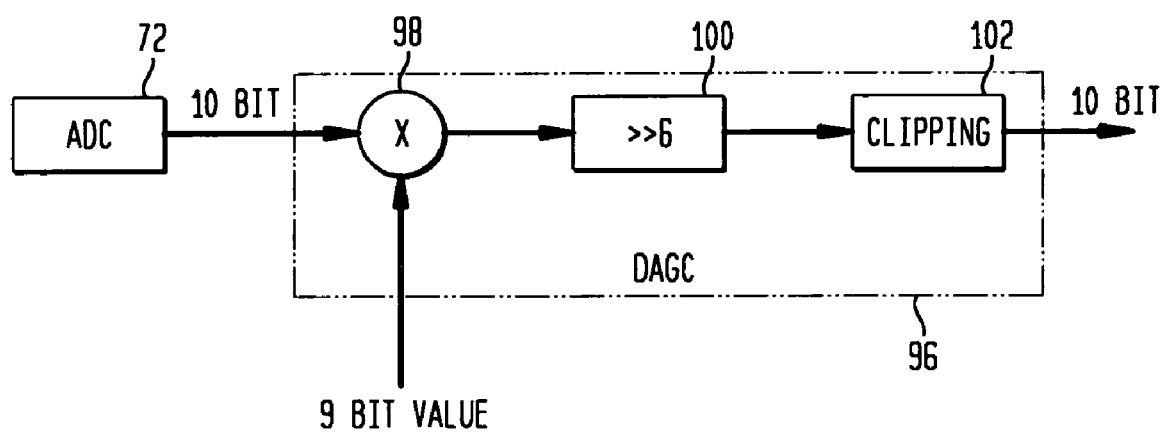
FIG. 5 is a schematic diagram showing a Digital Automatic Gain Control (DAGC) in greater detail.

FIG. 5 is a schematic diagram showing a Digital Automatic Gain Control (DAGC) 96 in greater detail. A multiplier unit 98 multiplies the 10 bit output from the ADC 72, and the 9 bit output from the TDM_OFDM AGC control 78. The output from multiplier unit 98 is fed into a bit shift unit 100, which down-shifts the signal by 6 bits. The output from bit shift unit 100 is then processed by a clipping unit 102, which ensures that the output does not exceed a 10 bit signal. That 10 bit signal is then produced as the output of the DAGC 96.

The above-described steps can be implemented using standard well-known programming techniques. The novelty of the above-described embodiment primarily lies not in the specific programming techniques but in the use of the steps described to achieve the described results. Software programming code which embodies the present invention is typically stored in permanent memory of some type, such as permanent storage of a workstation located at Agere Systems in Allentown, Pa. In a client/server environment, such software programming code may be stored in memory associated with a server. The software programming code may be embodied on any of a variety of known media for use with a data processing system, such as a diskette, or hard drive, or CD-ROM. The code may be distributed on such media, or may be distributed to users from the memory or storage of one computer system over a network of some type to other computer systems for use by users of such other systems. The techniques and methods for embodying software program code on physical media and/or distributing software code via networks are well known and will not be further discussed herein.

It will be understood that each element of the illustrations, and combinations of elements in the illustrations, can be implemented by general and/or special purpose hardware-based systems that perform the specified functions or steps, or by combinations of general and/or special-purpose hardware and computer instructions.

These program instructions may be provided to a processor to produce a machine, such that the instructions that execute on the processor create means for implementing the functions specified in the illustrations. The computer program instructions may be executed by a processor to cause a series of operational steps to be performed by the processor to produce a computer-implemented process such that the instructions that execute on the processor provide steps for implementing the functions specified in the illustrations. Accordingly, the figures support combinations of means for performing the specified functions, combinations of steps for performing the specified functions, and program instruction means for performing the specified functions.

Although the invention has been described in language specific to structural features and/or methodological acts, it is to be understood that the invention defined in the appended claims is not necessarily limited to the specific features or acts described. Rather, the specific features and acts are disclosed as exemplary forms of implementing the claimed invention

What is claimed is:

1. A method of automatically controlling an amplifier gain, said method comprising the steps of:

providing an analogue amplifier having said amplifier gain and an output connected to a first and a second digital back-end via an analogue-to-digital converter, said first and second digital back-ends each including an automatic-gain-control circuit;

determining a first automatic-gain-control signal, using said automatic-gain-control circuit of said first digital back-end, said first automatic-gain-control signal intended for a first dynamic range of said amplifier gain adapted to work with said first digital back-end;

determining a second automatic-gain-control signal, using said automatic-gain-control circuit of second digital back-end, said second automatic-gain-control signal intended for a second dynamic range of said amplifier gain adapted to work with said second digital back-end;

selecting said first automatic-gain-control signal to set said amplifier gain to a first amplifier gain value within said first dynamic range; and adjusting said second back-end to operate as if said amplifier gain was set within said second dynamic range.

2. The method of claim 1 further comprising the steps of:

selecting said second automatic-gain-control signal to set said amplifier gain to a second amplifier gain value within said second dynamic range; and adjusting said first back-end to operate as if said amplifier gain was set within said first dynamic range.

3. The method of claim 2 further comprising the step of choosing between said steps of selecting, and wherein said steps of adjusting further comprise the step of providing compensatory gain values.

4. The method of claim 3 wherein said first back-end further comprises a first digital automatic gain control; and further comprising the steps of providing an automatic gain control selector to perform said steps of choosing and adjusting, and wherein said step of providing compensatory gain values comprises setting said first digital automatic gain control in said first back end to a first compensatory gain value.

5. The method of claim 4 wherein said second back-end further comprises a second digital automatic gain control, and wherein said step of adjusting further comprise setting said first digital gain control to a second compensatory gain value, said second digital gain control to a third compensatory gain value and said amplifier gain to a third amplifier gain value, such that the combination of said third amplifier gain value and said third compensatory gain value is substantially equal to said second amplifier gain value, and where a difference between said third compensatory gain value and said second compensatory gain value is substantially equal to said first compensatory gain value.

6. The method of claim 5 wherein said first digital back-end demodulates a time division multiplex signal and wherein said second digital back-end demodulates an orthogonal frequency division multiplexed signal.

7. The method of claim 6 wherein said first dynamic range is approximately 74 dB and said second dynamic range is approximately 126 dB.

8. The method of claim 5 wherein said first digital back-end demodulates a signal received directly from a satellite and wherein said second digital back-end demodulates signal received from a terrestrial broadcast transmitter.

9. A system for automatically controlling an amplifier gain, comprising:
an analogue amplifier having said amplifier gain and an output connected to a first and a second digital back-end via an analogue to digital converter;
a first automatic-gain-control signal intended for a first dynamic range of said amplifier gain, and determined using said first digital back-end;
a second automatic-gain-control signal intended for a second dynamic range of said amplifier gain, and determined using said second digital back-end;
means for selecting said first automatic-gain-control signal to set said amplifier gain to a first amplifier gain value within said first dynamic range; and
means for adjusting said second back-end to operate as if said amplifier gain was set within said second dynamic range.

10. The system of claim 9 further comprising:
means for selecting said second automatic-gain-control signal to set said amplifier gain to a second amplifier gain value within said second dynamic range; and
means for adjusting said first back-end to operate as if said amplifier gain was set within said first dynamic range.

11. The system of claim 10 wherein said first back-end further comprises a first digital automatic gain control, and wherein said means for selecting is an automatic gain control selector sets said first digital automatic gain control to a first compensatory gain value.

12. The system of claim 11 wherein said second back-end further comprises a second digital automatic gain control, and wherein said automatic gain control selector sets said first digital gain control to a second compensatory gain value, said second digital gain control to a third compensatory gain value and said amplifier gain to a third amplifier gain value, such that the combination of said third amplifier gain value and said third compensatory gain value is substantially equal to said second amplifier gain value, and where a difference between said third compensatory gain value and said second compensatory gain value is substantially equal to said first compensatory gain value.

13. The system of claim 12 wherein said first digital back-end demodulates a time division multiplex signal and wherein said second digital back-end demodulates an orthogonal frequency division multiplexed signal.

14. The system of claim 13 wherein said first dynamic range is approximately 74 dB and said second dynamic range is approximately 126 dB.

15. The system of claim 12 wherein said first digital back-end is demodulates a signal received directly from a satellite and wherein said second digital back-end demodulates a signal received from a terrestrial broadcast transmitter.

16. A computer program product embodied on a computer-readable medium for automatically controlling an amplifier gain, said product comprising computer executable instructions for:
determining a first automatic-gain-control signal, using a first digital back-end, said first automatic-gain-control signal intended for a first dynamic range of an amplifier gain of an analogue amplifier having an output connected to said first digital back-end and to a second digital back-end via an analogue to digital converter;
determining a second automatic-gain-control signal, using said second digital back-end, said second automatic-gain-control signal intended for a second dynamic range of said amplifier gain;
selecting said first automatic-gain-control signal to set said amplifier gain to a first amplifier gain value within said first dynamic range; and
adjusting said second back-end to operate as if said amplifier gain was set within said second dynamic range.

17. The computer program product of claim 16, further comprising instructions for setting a first digital automatic gain control of said first back-end to a first compensatory gain value using an automatic gain control selector.

18. The computer program product of claim 17, further comprising instructions for setting said first digital gain control to a second compensatory gain value, a second digital gain control of said second digital back-end to a third compensatory gain value and said amplifier gain to a third amplifier gain value, such that the combination of said third amplifier gain value and said third compensatory gain value is substantially equal to said second amplifier gain value, and where a difference between said third compensatory gain value and said second compensatory gain value is substantially equal to said first compensatory gain value.

19. A computing device comprising: a computer-readable medium comprising computer executable instructions for:
determining a first automatic-gain-control signal, using a first digital back-end, said first automatic-gain-control signal intended for a first dynamic range of an amplifier gain of an analogue amplifier having an output connected to said first digital back-end and to a second digital back-end via an analogue to digital converter;
determining a second automatic-gain-control signal, using said second digital back-end, said second automatic-gain-control signal intended for a second dynamic range of said amplifier gain;

selecting said first automatic-gain-control signal to set said amplifier gain to a first amplifier gain value within said first dynamic range; and adjusting said second back-end to operate as if said amplifier gain was set within said second dynamic range.

20. The computing device of claim 19 further comprising instructions for setting a first digital automatic gain control of said first back-end to a first compensatory gain value using an automatic gain control selector.

21. The computing device of claim 20 further comprising instructions for setting said first digital gain control to a second compensatory gain value, a second digital gain control of said second digital back-end to a third compensatory gain value and said amplifier gain to a third amplifier gain value, such that the combination of said third amplifier gain value and said third compensatory gain value is substantially equal to said second amplifier gain value, and where a difference between said third compensatory gain value and said second compensatory gain value is substantially equal to said first compensatory gain value.

22. A system for automatically controlling an amplifier gain, comprising:

an analogue amplifier having said amplifier gain and an output connected to a first and a second digital back-end via an analogue to digital converter;

a first automatic-gain-control signal intended for a first dynamic range of said amplifier gain, and determined using said first digital back-end;

a second automatic-gain-control signal intended for a second dynamic range of said amplifier gain, and determined using said second digital back-end;

an automatic gain control selector for selecting said first automatic-gain-control signal to set said amplifier gain to a first amplifier gain value within said first dynamic range; and a digital automatic gain control for adjusting said second back-end to operate as if said amplifier gain was set within said second dynamic range.

23. The system of claim 22 wherein said automatic gain control selector further selects said second automatic-gain-control signal to set said amplifier gain to a second amplifier gain value within said second dynamic range; and a second digital automatic gain control for adjusting said first back-end to operate as if said amplifier gain was set within said first dynamic range.

* * * * *